United States Patent
Sakai et al.

(10) Patent No.: US 11,916,029 B2
(45) Date of Patent: Feb. 27, 2024

(54) SEMICONDUCTOR DEVICE

(71) Applicant: SUMITOMO ELECTRIC INDUSTRIES, LTD., Osaka (JP)

(72) Inventors: Mitsuhiko Sakai, Osaka (JP); Hirotaka Oomori, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 282 days.

(21) Appl. No.: 17/601,188

(22) PCT Filed: Mar. 10, 2020

(86) PCT No.: PCT/JP2020/010216
§ 371 (c)(1),
(2) Date: Oct. 4, 2021

(87) PCT Pub. No.: WO2020/208990
PCT Pub. Date: Oct. 15, 2020

(65) Prior Publication Data
US 2022/0181281 A1 Jun. 9, 2022

(30) Foreign Application Priority Data

Apr. 8, 2019 (JP) .................................. 2019-073401

(51) Int. Cl.
*H01L 23/00* (2006.01)
*H01L 29/45* (2006.01)
*H01L 29/49* (2006.01)

(52) U.S. Cl.
CPC .............. *H01L 24/05* (2013.01); *H01L 24/06* (2013.01); *H01L 24/45* (2013.01); *H01L 24/46* (2013.01);
(Continued)

(58) Field of Classification Search
CPC .......... H01L 24/05; H01L 24/06; H01L 24/45; H01L 24/46; H01L 29/45; H01L 29/495; H01L 23/3171
See application file for complete search history.

(56) References Cited

U.S. PATENT DOCUMENTS 6,656,828 B1 12/2003 Maitani
2006/0099919 A1 5/2006 Sorrells et al.
(Continued)

FOREIGN PATENT DOCUMENTS

JP 2008-91457 A 4/2008
JP 2009-177104 A 8/2009
(Continued)

*Primary Examiner* — Marc Anthony Armand
(74) *Attorney, Agent, or Firm* — Renner, Otto, Boisselle & Sklar, LLP

(57) ABSTRACT

A semiconductor device of the present disclosure includes: a semiconductor substrate having a first main surface; a first aluminum electrode having a first surface facing the first main surface and a second surface opposite to the first surface, the first aluminum electrode being disposed on the semiconductor substrate; a passivation film that covers a peripheral edge of the second surface and that is provided with an opening from which a portion of the second surface is exposed; and a copper film. The second surface exposed from the opening is provided with a recess that is depressed toward the first surface. The copper film is disposed in the recess.

6 Claims, 11 Drawing Sheets

(52) U.S. Cl.
CPC ............ *H01L 29/45* (2013.01); *H01L 29/495* (2013.01); *H01L 2224/04042* (2013.01); *H01L 2224/05582* (2013.01); *H01L 2224/05624* (2013.01); *H01L 2224/05647* (2013.01); *H01L 2224/06505* (2013.01); *H01L 2224/45124* (2013.01); *H01L 2224/45147* (2013.01); *H01L 2924/13091* (2013.01); *H01L 2924/365* (2013.01)

(56) References Cited

U.S. PATENT DOCUMENTS

| | | |
|---|---|---|
| 2008/0099919 A1 | 5/2008 | Ozawa |
| 2008/0203568 A1 | 8/2008 | Tanaka |
| 2011/0186962 A1 | 8/2011 | Moriyama |
| 2017/0148700 A1* | 5/2017 | Narita ................. H01L 29/7397 |
| 2019/0172812 A1 | 6/2019 | Okabe |
| 2019/0326237 A1* | 10/2019 | Iwamizu ................. H01L 24/45 |

FOREIGN PATENT DOCUMENTS

| | | |
|---|---|---|
| JP | 2011-222963 A | 11/2011 |
| JP | 2017-69366 A | 4/2017 |
| JP | 6239214 B1 | 11/2017 |
| WO | 00/44043 A1 | 7/2000 |

* cited by examiner

SEMICONDUCTOR DEVICE

TECHNICAL FIELD

The present disclosure relates to a semiconductor device. The present application claims a priority based on Japanese Patent Application No. 2019-073401 filed on Apr. 8, 2019, the entire content of which is incorporated herein by reference.

BACKGROUND ART

PTL 1 (Japanese Patent No. 6239214) describes a semiconductor device. The semiconductor device described in PTL 1 has: a semiconductor substrate composed of single crystal silicon carbide (SiC); an aluminum (Al) electrode disposed on the semiconductor substrate, the aluminum electrode having a first surface facing the semiconductor substrate side and a second surface opposite to the first surface; a polyimide film that covers a peripheral edge of the second surface of the aluminum electrode and that is provided with an opening from which a portion of the second surface of the aluminum electrode is exposed; and a copper (Cu) film disposed on the second surface of the aluminum electrode exposed from the opening of the polyimide film. When copper in the copper film is diffused into the polyimide film, reliability of the polyimide film is deteriorated. Therefore, in the semiconductor device described in PTL 1, the diffusion of copper into the polyimide film is prevented by disposing the copper film at a position separated from the polyimide film.

CITATION LIST

Patent Literature

PTL 1: Japanese Patent No. 6239214

SUMMARY OF INVENTION

A semiconductor device of the present disclosure includes: a semiconductor substrate having a first main surface; a first aluminum electrode having a first surface facing the first main surface and a second surface opposite to the first surface, the first aluminum electrode being disposed on the semiconductor substrate; a passivation film that covers a peripheral edge of the second surface and that is provided with an opening from which a portion of the second surface is exposed; and a copper film. The second surface exposed from the opening is provided with a recess that is depressed toward the first surface. The copper film is disposed in the recess.

DETAILED DESCRIPTION

Figure 1:
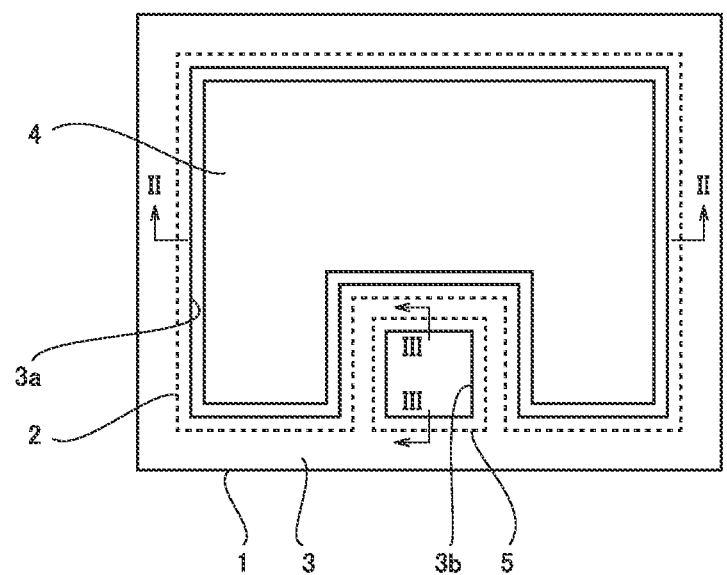
FIG. 1 is a top view of a semiconductor device according to an embodiment.

Problem to be Solved by the Present Disclosure

In the semiconductor device described in PTL 1, a sealing member is provided between the polyimide film and the copper film. Since the sealing member is composed of a resin material, there is room for improvement in heat radiation from the aluminum electrode in the semiconductor device described in PTL 1.

An object of the present disclosure is to provide a semiconductor device to improve heat radiation from an aluminum electrode while suppressing diffusion of copper from a copper film into a passivation film.

Advantageous Effect of the Present Disclosure

According to the present disclosure, heat radiation from an aluminum electrode can be improved while suppressing diffusion of copper from a copper film into a passivation film.

DESCRIPTION OF EMBODIMENTS

First, embodiments of the present disclosure are listed and described.

(1) A semiconductor device according to one embodiment includes: a semiconductor substrate having a first main surface; a first aluminum electrode having a first surface facing the first main surface and a second surface opposite to the first surface, the first aluminum electrode being disposed on the semiconductor substrate; a passivation film that covers a peripheral edge of the second surface and that is provided with an opening from which a portion of the second surface is exposed; and a copper film. The second surface exposed from the opening is provided with a recess that is depressed toward the first surface. The copper film is disposed in the recess.

According to the semiconductor device according to (1), heat radiation from the aluminum electrode can be improved while suppressing diffusion of copper from the copper film into the passivation film.

(2) In the semiconductor device according to (1), the passivation film may be a polyimide film.

(3) In the semiconductor device according to (1) or (2), the semiconductor substrate may be a silicon carbide semiconductor substrate.

(4) The semiconductor device according to any one of (1) to (3) may further include: a second aluminum electrode disposed on the semiconductor substrate; a plurality of first bonding wires connected to the copper film; and a second bonding wire connected to the second aluminum electrode. Each of the first bonding wires may be composed of copper or a copper alloy. The second bonding wire may be composed of aluminum or an aluminum alloy.

(5) The semiconductor device according to any one of (1) to (4) may further include: a gate; and a gate insulating film. The semiconductor substrate may have a second main surface opposite to the first main surface, a source region disposed in the first main surface, a drain region that constitutes the second main surface, a drift region disposed on the first main surface side of the drain region, and a body region that separates the drift region and the source region from each other. The gate may face a portion of the body region between the drift region and the source region with the gate insulating film being interposed between the gate and the portion of the body region. The second aluminum electrode may be electrically connected to the gate. The first aluminum electrode may be electrically connected to the source region.

(6) A semiconductor device according to another embodiment includes: a semiconductor substrate having a first main surface; a first aluminum electrode having a first surface facing the first main surface and a second surface opposite to the first surface, the first aluminum electrode being disposed on the semiconductor substrate; a passivation film that covers a peripheral edge of the second surface and that is provided with an opening from which a portion of the second surface is exposed; a copper film; a second aluminum electrode disposed on the semiconductor substrate; a plurality of first bonding wires connected to the copper film; a second bonding wire connected to the second aluminum electrode; a gate; and a gate insulating film. The second surface exposed from the opening is provided with a recess that is depressed toward the first surface. The copper film is disposed in the recess. The passivation film is a polyimide film. Each of the first bonding wires is composed of copper or a copper alloy. The second bonding wire is composed of aluminum or an aluminum alloy. The semiconductor substrate has a second main surface opposite to the first main surface, a source region disposed in the first main surface, a drain region that constitutes the second main surface, a drift region disposed on the first main surface side of the drain region, and a body region that separates the drift region and the source region from each other. The gate faces a portion of the body region between the drift region and the source region with the gate insulating film being interposed between the gate and the portion of the body region. The second aluminum electrode is electrically connected to the gate. The first aluminum electrode is electrically connected to the source region.

(7) A semiconductor device according to another embodiment includes: a semiconductor substrate having a first main surface; a first aluminum electrode having a first surface facing the first main surface and a second surface opposite to the first surface, the first aluminum electrode being disposed on the semiconductor substrate; a passivation film that covers a peripheral edge of the second surface and that is provided with an opening from which a portion of the second surface is exposed; a copper film; a second aluminum electrode disposed on the semiconductor substrate; a plurality of first bonding wires connected to the copper film; a second bonding wire connected to the second aluminum electrode; a gate; and a gate insulating film. The second surface exposed from the opening is provided with a recess that is depressed toward the first surface. The copper film is disposed in the recess. The passivation film is a polyimide film. The semiconductor substrate is a silicon carbide semiconductor substrate. Each of the first bonding wires is composed of copper or a copper alloy. The second bonding wire is composed of aluminum or an aluminum alloy. The semiconductor substrate has a second main surface opposite to the first main surface, a source region disposed in the first main surface, a drain region that constitutes the second main surface, a drift region disposed on the first main surface side of the drain region, and a body region that separates the drift region and the source region from each other. The gate faces a portion of the body region between the drift region and the source region with the gate insulating film being interposed between the gate and the portion of the body region. The second aluminum electrode is electrically connected to the gate. The first aluminum electrode is electrically connected to the source region.

DETAILS OF EMBODIMENTS OF THE PRESENT DISCLOSURE

Next, details of the embodiments of the present disclosure will be described with reference to figures. In the figures below, the same or corresponding portions are denoted by the same reference characters, and will not be described repeatedly.

Configuration of Semiconductor Device According to Embodiment

Hereinafter, a configuration of a semiconductor device according to an embodiment will be described.

<Schematic Configuration of Semiconductor Device According to Embodiment>

FIG. 1 is a top view of a semiconductor device according to an embodiment.

Figure 2:
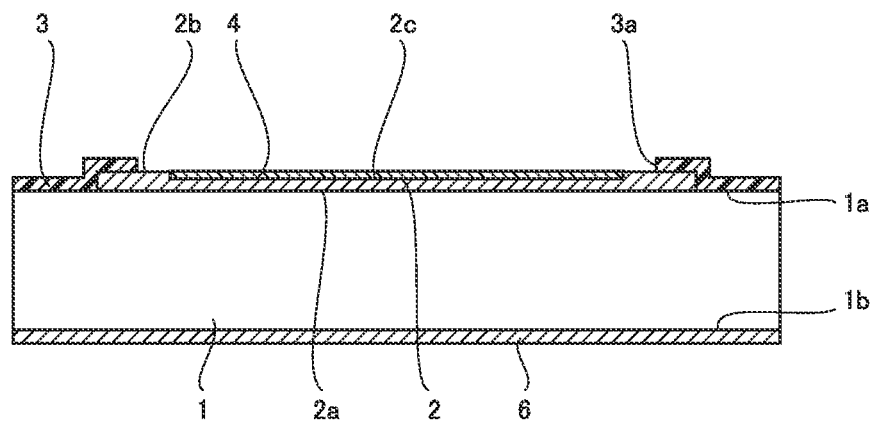
FIG. 2 is a cross sectional view taken along II-II in FIG. 1.

FIG. 2 is a cross sectional view taken along II-II of FIG. 1. As shown in FIGS. 1 and 2, the semiconductor device according to the embodiment has a semiconductor substrate 1, a first aluminum electrode 2, a passivation film 3, and a copper film 4. The semiconductor device according to the embodiment further has a second aluminum electrode 5 and a third aluminum electrode 6.

Semiconductor substrate 1 is composed of, for example, single crystal silicon carbide. Semiconductor substrate 1 has a first main surface 1a and a second main surface 1b. Second main surface 1b is opposite to first main surface 1a.

First aluminum electrode 2 is disposed on semiconductor substrate 1. More specifically, first aluminum electrode 2 is disposed on first main surface 1a of semiconductor substrate 1. First aluminum electrode 2 is composed of pure aluminum or an aluminum alloy. First aluminum electrode 2 has a first surface 2a and a second surface 2b. First surface 2a faces first main surface 1a. Second surface 2b is opposite to first surface 2a.

Passivation film 3 is disposed on semiconductor substrate 1. Specifically, passivation film 3 covers a peripheral edge of second surface 2b of first aluminum electrode 2. The passivation film is provided with an opening 3a from which a portion of second surface 2b of first aluminum electrode 2 is exposed. Second surface 2b exposed from opening 3a is provided with a recess 2c. Second surface 2b exposed from opening 3a is depressed toward the first surface 2a side in recess 2c. Preferably, when viewed in a top view, recess 2c is separated from passivation film 3.

Passivation film 3 is composed of, for example, polyimide. However, passivation film 3 is not limited thereto. Passivation film 3 may be composed of an insulative resin material other than polyimide. Passivation film 3 may be composed of silicon oxide ($SiO_2$), silicon nitride ($Si_3N_4$), silicon oxynitride (SiON), or the like.

Copper film 4 is disposed on first aluminum electrode 2. Specifically, copper film 4 is disposed in recess 2c of first aluminum electrode 2. Therefore, copper film 4 is not in contact with passivation film 3. Copper film 4 is composed of pure copper or a copper alloy.

Figure 3:
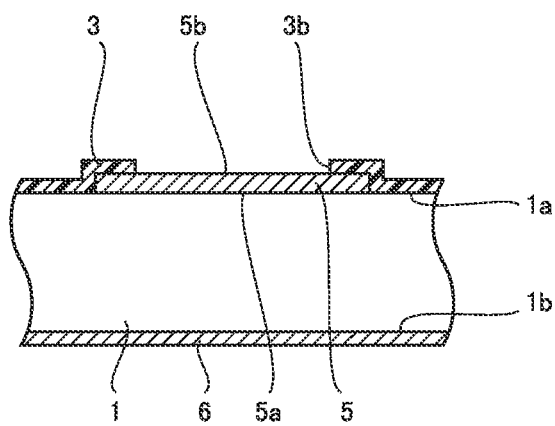
FIG. 3 is a cross sectional view taken along in FIG. 1.

FIG. 3 is a cross sectional view taken along in FIG. 1. As shown in FIG. 3, second aluminum electrode 5 is disposed on semiconductor substrate 1. More specifically, second aluminum electrode 5 is disposed on first main surface 1a of semiconductor substrate 1. Second aluminum electrode 5 is composed of pure aluminum or an aluminum alloy. Second aluminum electrode 5 has a third surface 5a and a fourth surface 5b. Third surface 5a faces first main surface 1a. Fourth surface 5b is opposite to third surface 5a.

Further, passivation film 3 covers a peripheral edge of fourth surface 5b of second aluminum electrode 5. Passivation film 3 is also provided with an opening 3b from which a portion of fourth surface 5b of second aluminum electrode 5 is exposed. Fourth surface 5b of second aluminum electrode 5 exposed from opening 3b is provided with no recess. No copper film is disposed on second aluminum electrode 5 exposed from opening 3b.

As shown in FIGS. 2 and 3, third aluminum electrode 6 is disposed on second main surface 1b of semiconductor substrate 1. Third aluminum electrode 6 is composed of pure aluminum or an aluminum alloy.

Detailed Structure of Semiconductor Device According to Embodiment

Figure 4:
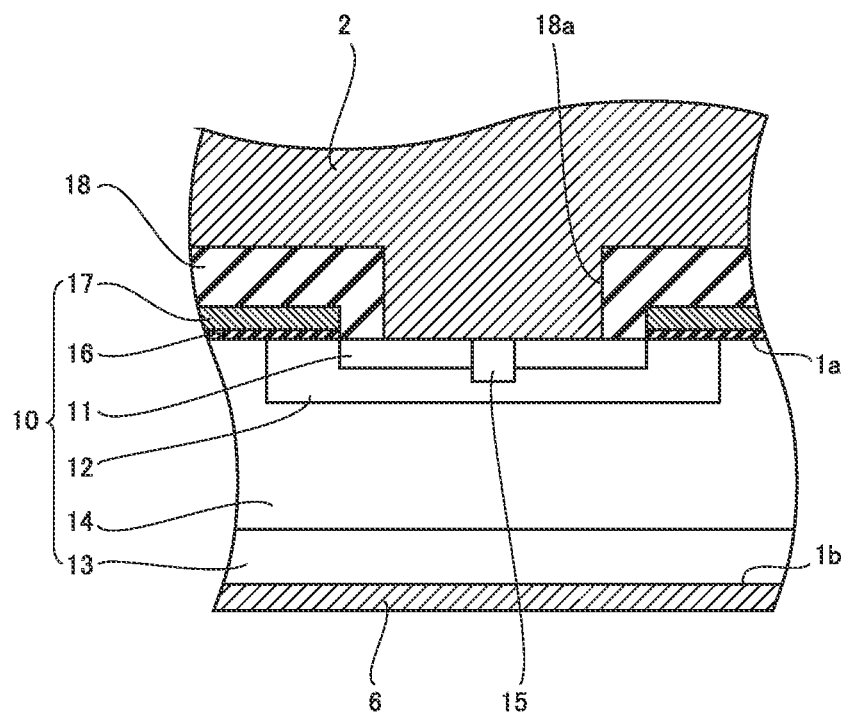
FIG. 4 is a cross sectional view showing a detailed internal structure of the semiconductor device according to the embodiment.

FIG. 4 is a cross sectional view showing a detailed internal structure of the semiconductor device according to the embodiment. As shown in FIG. 4, semiconductor substrate 1 has source regions 11, a body region 12, a drain region 13, a drift region 14, and a body contact region 15. The semiconductor device according to the embodiment further has a gate insulating film 16, a gate 17, and an interlayer insulating film 18.

Each of source regions 11 is disposed in first main surface 1a of semiconductor substrate 1. The conductivity type of source region 11 is a first conductivity type. The first conductivity type is, for example, n type. Body region 12 is disposed in first main surface 1a of semiconductor substrate 1 to surround source region 11. The conductivity type of body region 12 is a second conductivity type. The second conductivity type is a conductivity type opposite to the first conductivity type. That is, the second conductivity type is, for example, p type.

The end surface of drain region 13 constitutes second main surface 1b. The conductivity type of drain region 13 is the first conductivity type. Drain region 13 is electrically connected to third aluminum electrode 6. That is, third aluminum electrode 6 serves as a drain electrode of the semiconductor device according to the embodiment.

Drift region 14 surrounds body region 12 and is disposed in first main surface 1a of semiconductor substrate 1. From another viewpoint, it can be said that drift region 14 is disposed on drain region 13 (i.e., on the first main surface 1a side of drain region 13), and drift region 14 and source region 11 are separated from each other by body region 12. The conductivity type of drift region 14 is the first conductivity type. The impurity concentration in drift region 14 is less than the impurity concentration in each of source region 11 and drain region 13. In the description below, a portion of body region 12 in first main surface 1a of semiconductor substrate 1 between source region 11 and drift region 14 is referred to as a channel region.

Body contact region 15 is disposed in first main surface 1a of semiconductor substrate 1 between two adjacent source regions 11. Body contact region 15 has a depth to reach body region 12. The conductivity type of body contact region 15 is the second conductivity type. The impurity concentration in body contact region 15 is more than the impurity concentration in body region 12.

Gate insulating film 16 is disposed on first main surface 1a of semiconductor substrate 1. More specifically, gate insulating film 16 is disposed on the channel region. Gate insulating film 16 is composed of, for example, silicon oxide.

Gate 17 is disposed on gate insulating film 16. That is, gate 17 is disposed to face the channel region with gate 17 being insulated by gate insulating film 16. Gate 17 is composed of, for example, polycrystalline silicon (Si) doped with an impurity. Although not shown, gate 17 is electrically connected to second aluminum electrode 5. That is, second aluminum electrode 5 serves as a gate electrode of the semiconductor device according to the embodiment.

Source region 11, body region 12, drain region 13, drift region 14, gate insulating film 16, and gate 17 form a transistor 10. Transistor 10 is a planar gate type power MOSFET (Metal Oxide Semiconductor Field Effect Transistor).

Interlayer insulating film 18 is disposed on first main surface 1a of semiconductor substrate 1 so as to cover gate 17. Interlayer insulating film 18 is composed of, for example, silicon oxide. Interlayer insulating film 18 is provided with a contact hole 18a. Contact hole 18a extends through interlayer insulating film 18 in a thickness direction. Source region 11 and body contact region 15 are exposed from contact hole 18a.

First aluminum electrode 2 is disposed on interlayer insulating film 18. Further, first aluminum electrode 2 is also disposed in contact hole 18a. Thus, first aluminum electrode 2 is electrically connected to source region 11 and body contact region 15. That is, first aluminum electrode 2 serves as a source electrode.

In the above example, the semiconductor device according to the embodiment has been described as having the planar gate type power MOSFET; however, the semiconductor device according to the embodiment may have another semiconductor element. For example, the semiconductor device according to the embodiment may have a trench gate type power MOSFET. Further, the semiconductor device according to the embodiment may have a semiconductor element other than the transistor (for example, a Schottky barrier diode).

External Connection of Semiconductor Device According to Embodiment

Figure 5:
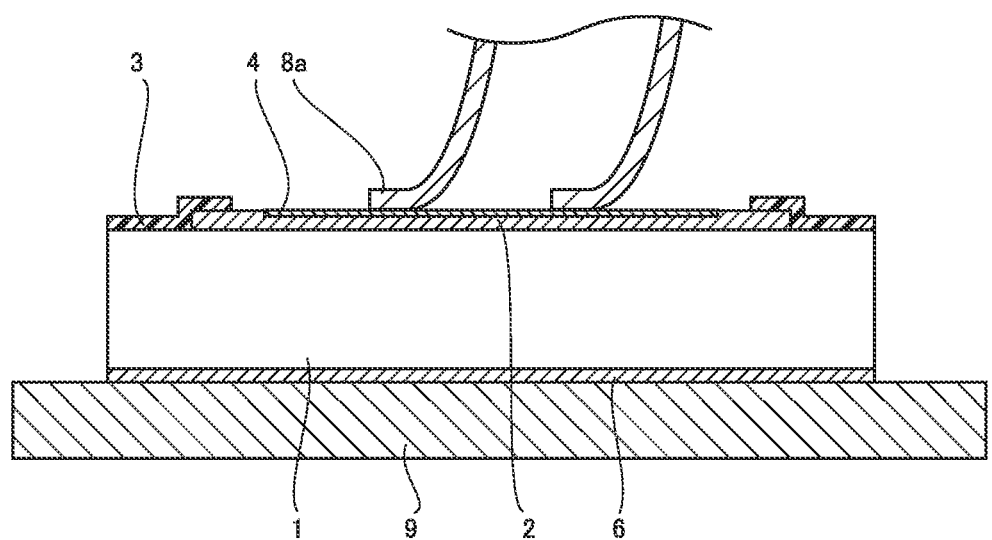
FIG. 5 is a first cross sectional view showing a state of external connection of the semiconductor device according to the embodiment.

FIG. 5 is a first cross sectional view showing a state of external connection of the semiconductor device according to the embodiment. As shown in FIG. 5, first aluminum electrode 2 is externally connected by wire boding, i.e., bonding a bonding wire 8a to copper film 4. Bonding wire 8a is preferably composed of pure copper or a copper alloy. A plurality of bonding wires 8a are preferably provided. Third aluminum electrode 6 is electrically connected to a base plate 9 by soldering, for example.

Figure 6:
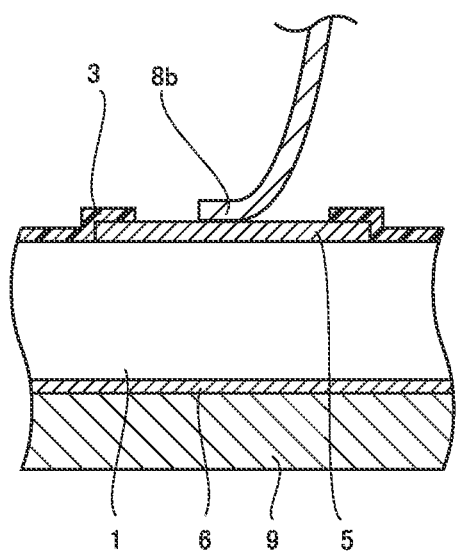
FIG. 6 is a second cross sectional view showing a state of external connection of the semiconductor device according to the embodiment.

FIG. 6 is a second cross sectional view showing a state of external connection of the semiconductor device according to the embodiment. As shown in FIG. 6, second aluminum electrode 5 is externally connected by wire bonding using a bonding wire 8b. Bonding wire 8b is composed of pure aluminum or an aluminum alloy, for example.

Although not shown, the semiconductor device according to the embodiment, bonding wire 8a, and bonding wire 8b may be sealed by a resin.

Method of Manufacturing Semiconductor Device According to Embodiment

Hereinafter, a method of manufacturing the semiconductor device according to the embodiment will be described.

Figure 7:
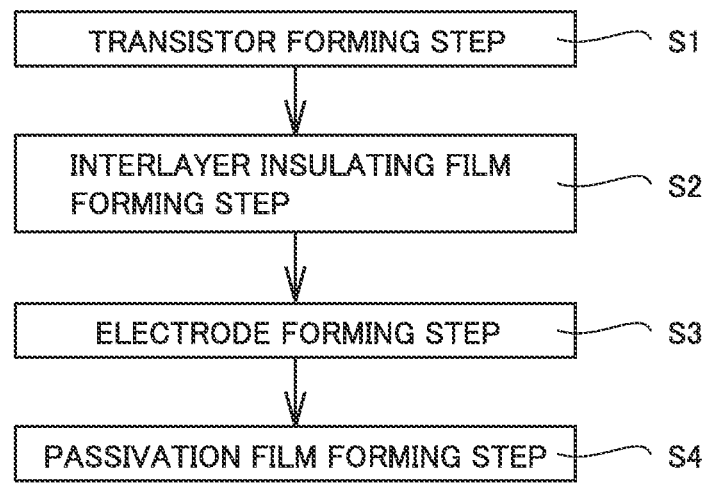
FIG. 7 is a flowchart of a method of manufacturing the semiconductor device according to the embodiment.
Figure 8:
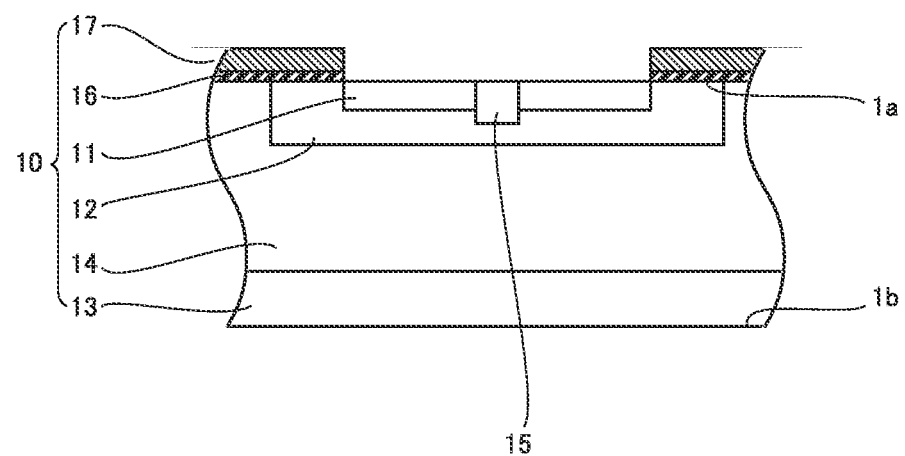
FIG. 8 is a cross sectional view of the semiconductor device according to the embodiment in a transistor forming step S1.

FIG. 7 is a flowchart of a method of manufacturing the semiconductor device according to the embodiment. As shown in FIG. 7, the method of manufacturing the semiconductor device according to the embodiment includes a transistor forming step S1, an interlayer insulating film forming step S2, an electrode forming step S3, and a passivation film forming step S4. FIG. 8 is a cross sectional view of the semiconductor device according to the embodiment in transistor forming step S1. As shown in FIG. 8, in transistor forming step S1, transistor 10 is formed.

More specifically, a base member is first prepared. This base member is composed of single crystal silicon carbide doped with an impurity. Next, an epitaxial layer is formed on the base member. Further, ion implantation and activation annealing are performed onto the epitaxial layer to form source region 11, body region 12, and body contact region 15. A portion of the epitaxial layer having not been subjected to the ion implantation becomes drift region 14, and the base member becomes drain region 13. In this way, semiconductor substrate 1 is prepared.

Gate insulating film 16 is formed by thermally oxidizing first main surface 1a of semiconductor substrate 1. Gate 17 is formed by forming a film using a material of gate 17 through CVD (Chemical Vapor Deposition) or the like and by patterning the formed film of the material of gate 17.

Figure 9:
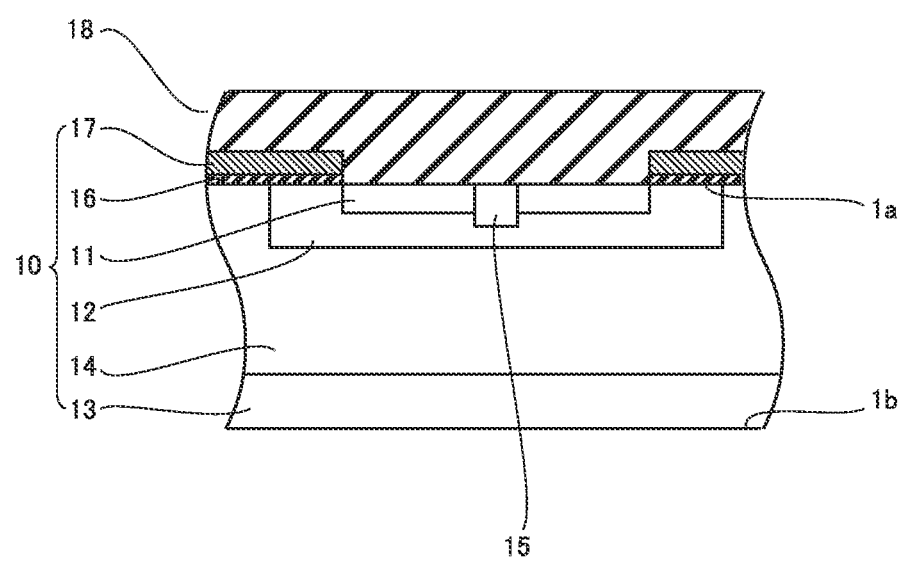
FIG. 9 is a cross sectional view of the semiconductor device according to the embodiment in an interlayer insulating film forming step S2.

FIG. 9 is a cross sectional view of the semiconductor device according to the embodiment in interlayer insulating film forming step S2. As shown in FIG. 9, in interlayer insulating film forming step S2, interlayer insulating film 18 is formed. Interlayer insulating film 18 is formed by forming a film using a material of interlayer insulating film 18 through CVD or the like and planarizing the formed film of the material of interlayer insulating film 18 through CMP (Chemical Mechanical Polishing) or the like.

Figure 10:
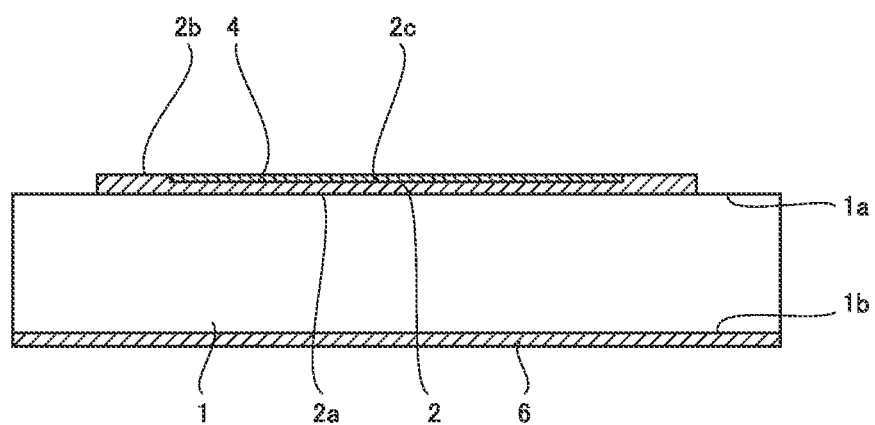
FIG. 10 is a cross sectional view of the semiconductor device according to the embodiment in an electrode forming step S3.

FIG. 10 is a cross sectional view of the semiconductor device according to the embodiment in electrode forming step S3. In electrode forming step S3, as shown in FIG. 10, first aluminum electrode 2, copper film 4, and third aluminum electrode 6 are formed. It should be noted that although not shown, second aluminum electrode 5 is also formed in electrode forming step S3.

First, in electrode forming step S3, contact hole 18a is formed in interlayer insulating film 18 by anisotropic dry etching or the like. Second, in electrode forming step S3, the films of the material of first aluminum electrode 2 and second aluminum electrode 5 are formed on interlayer insulating film 18 and in contact hole 18a through sputtering or the like.

Third, in electrode forming step S3, recess 2c is formed in the formed film of the material of first aluminum electrode 2. Recess 2c is formed by etching the material of first aluminum electrode 2 using a photoresist provided with an opening in conformity with a position at which recess 2c is to be formed.

Fourth, in electrode forming step S3, copper film 4 is provided in recess 2c. Copper film 4 is formed by electroplating, for example. This electroplating is performed with the formed films of first aluminum electrode 2 and second aluminum electrode 5 being covered with the above-mentioned photoresist. Since the photoresist is provided with the opening at the position at which recess 2c is to be formed, copper film 4 is formed only in recess 2c.

Fifth, in electrode forming step S3, patterning is performed onto the formed films of first aluminum electrode 2 and second aluminum electrode 5. In this way, first aluminum electrode 2 and second aluminum electrode 5 are formed. Sixth, third aluminum electrode 6 is formed in electrode forming step S3. Third aluminum electrode 6 is formed by forming a film of the material of third aluminum electrode 6 on second main surface 1b of semiconductor substrate 1 through sputtering or the like.

In passivation film forming step S4, passivation film 3 is formed. When passivation film 3 is a polyimide film, passivation film 3 is formed by applying a polyimide film so as to cover first aluminum electrode 2 and second aluminum electrode 5, and subjecting the applied polyimide film to exposure to light and development.

When passivation film 3 is a silicon oxide, a silicon nitride, or a silicon oxynitride, passivation film 3 is formed by forming a film of the material of passivation film 3 through CVD or the like and performing etching to provide an opening in the formed film of the material of passivation film 3. In this way, the structure of the semiconductor device according to the embodiment as shown in FIGS. 1 to 4 is formed.

Effects of Semiconductor Device According to Embodiment

Hereinafter, effects of the semiconductor device according to the embodiment will be described in comparison with a comparative example.

Figure 11:
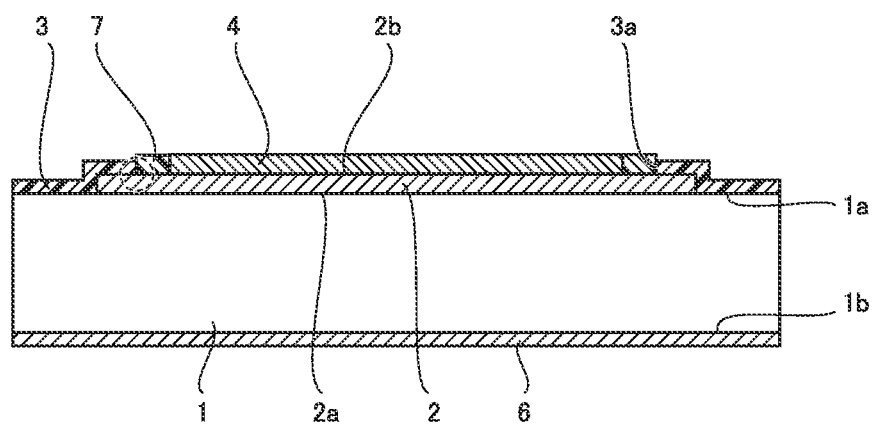
FIG. 11 is a cross sectional view of a semiconductor device according to a comparative example.

FIG. 11 is a cross sectional view of a semiconductor device according to a comparative example. As shown in FIG. 11, in the semiconductor device according to the comparative example, second surface 2b of first aluminum electrode 2 is not provided with recess 2c. Instead, in the semiconductor device according to the comparative example, copper film 4 is formed on second surface 2b of first aluminum electrode 2 so as to be separated from passivation film 3. In the semiconductor device according to the comparative example, a sealing material 7 is disposed on second surface 2b exposed from between copper film 4 and passivation film 3. Sealing material 7 is composed of an insulative resin material. The other configurations of the semiconductor device according to the comparative example are the same as those of the semiconductor device according to the embodiment.

In the semiconductor device according to the comparative example, sealing material 7 is disposed on second surface 2b exposed from between passivation film 3 and copper film 4, so that copper film 4 and passivation film 3 are not in contact with each other, thereby suppressing diffusion of copper from copper film 4 into passivation film 3. However, in the semiconductor device according to the comparative example, since a portion of second surface 2b exposed from opening 3a is covered with sealing material 7 composed of the resin material, heat radiation from first aluminum electrode 2 is decreased.

In the semiconductor device according to the embodiment, copper film 4 and passivation film 3 are not in contact with each other, thereby suppressing diffusion of copper from copper film 4 into passivation film 3. In addition, in the semiconductor device according to the embodiment, second surface 2b exposed from opening 3a has no portion covered with a material having poor heat conductivity, with the result that heat dissipation from first aluminum electrode 2 is less likely to be hindered. Therefore, according to the semiconductor device according to the embodiment, heat radiation from first aluminum electrode 2 can be improved while suppressing diffusion of copper from copper film 4 into passivation film 3.

The semiconductor device according to the comparative example has a portion at which three different types of materials (first aluminum electrode 2, passivation film 3, and sealing material 7) are joined (see an indication by a dotted line in FIG. 11). Thermal stress is likely to be applied to such a portion due to a difference in thermal expansion coefficient among the materials. On the other hand, the semiconductor device according to the embodiment does not have a portion at which such three different types of materials are joined, so that generation of thermal stress can be suppressed.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: semiconductor substrate; 1a: first main surface; 1b: second main surface; 2: first aluminum electrode; 2a: first surface; 2b: second surface; 2c: recess; 3: passivation film; 3a, 3b: opening; 4: copper film; 5: second aluminum electrode; 5a: third surface; 5b: fourth surface; 6: third aluminum electrode; 7: sealing material; 8a, 8b: bonding wire; 9: base plate; 10: transistor; 11: source region; 12: body region; 13: drain region; 14: drift region; 15: body contact region; 16: gate insulating film; 17: gate; 18: interlayer insulating film; 18a: contact hole; S1: transistor forming step; S2: interlayer insulating film forming step; S3: electrode forming step; S4: passivation film forming step.

The invention claimed is:

1. A semiconductor device comprising:
a semiconductor substrate having a first main surface;
a first aluminum electrode having a first surface facing the first main surface and a second surface opposite to the first surface, the first aluminum electrode being disposed on the semiconductor substrate;
a passivation film that covers a peripheral edge of the second surface and that is provided with an opening from which a portion of the second surface is exposed; and
a copper film, wherein
the second surface exposed from the opening is provided with a recess that is depressed toward the first surface, and
the copper film is disposed in the recess,
the semiconductor device further comprising:
a second aluminum electrode disposed on the semiconductor substrate;
a plurality of first bonding wires connected to the copper film; and
a second bonding wire connected to the second aluminum electrode, wherein
each of the first bonding wires is composed of copper or a copper alloy, and
the second bonding wire is composed of aluminum or an aluminum alloy.

2. The semiconductor device according to claim 1, wherein the passivation film is a polyimide film.

3. The semiconductor device according to claim 1, wherein the semiconductor substrate is a silicon carbide semiconductor substrate.

4. The semiconductor device according to claim 1, further comprising:
a gate; and
a gate insulating film, wherein
the semiconductor substrate has a second main surface opposite to the first main surface, a source region disposed in the first main surface, a drain region that constitutes the second main surface, a drift region disposed on the first main surface side of the drain region, and a body region that separates the drift region and the source region from each other,
the gate faces a portion of the body region between the drift region and the source region with the gate insulating film being interposed between the gate and the portion of the body region, and
the second aluminum electrode is electrically connected to the gate, and
the first aluminum electrode is electrically connected to the source region.

5. A semiconductor device comprising:
a semiconductor substrate having a first main surface;
a first aluminum electrode having a first surface facing the first main surface and a second surface opposite to the first surface, the first aluminum electrode being disposed on the semiconductor substrate;
a passivation film that covers a peripheral edge of the second surface and that is provided with an opening from which a portion of the second surface is exposed;
a copper film;
a second aluminum electrode disposed on the semiconductor substrate;
a plurality of first bonding wires connected to the copper film;
a second bonding wire connected to the second aluminum electrode;
a gate; and
a gate insulating film, wherein
the second surface exposed from the opening is provided with a recess that is depressed toward the first surface,
the copper film is disposed in the recess,
the passivation film is a polyimide film,
each of the first bonding wires is composed of copper or a copper alloy,
the second bonding wire is composed of aluminum or an aluminum alloy,
the semiconductor substrate has a second main surface opposite to the first main surface, a source region disposed in the first main surface, a drain region that constitutes the second main surface, a drift region disposed on the first main surface side of the drain region, and a body region that separates the drift region and the source region from each other,
the gate faces a portion of the body region between the drift region and the source region with the gate insulating film being interposed between the gate and the portion of the body region,
the second aluminum electrode is electrically connected to the gate, and
the first aluminum electrode is electrically connected to the source region.

6. A semiconductor device comprising:

a semiconductor substrate having a first main surface;

a first aluminum electrode having a first surface facing the first main surface and a second surface opposite to the first surface, the first aluminum electrode being disposed on the semiconductor substrate;

a passivation film that covers a peripheral edge of the second surface and that is provided with an opening from which a portion of the second surface is exposed;

a copper film;

a second aluminum electrode disposed on the semiconductor substrate;

a plurality of first bonding wires connected to the copper film;

a second bonding wire connected to the second aluminum electrode;

a gate; and a gate insulating film, wherein the second surface exposed from the opening is provided with a recess that is depressed toward the first surface, the copper film is disposed in the recess, the passivation film is a polyimide film, the semiconductor substrate is a silicon carbide semiconductor substrate, each of the first bonding wires is composed of copper or a copper alloy, the second bonding wire is composed of aluminum or an aluminum alloy, the semiconductor substrate has a second main surface opposite to the first main surface, a source region disposed in the first main surface, a drain region that constitutes the second main surface, a drift region disposed on the first main surface side of the drain region, and a body region that separates the drift region and the source region from each other, the gate faces a portion of the body region between the drift region and the source region with the gate insulating film being interposed between the gate and the portion of the body region, the second aluminum electrode is electrically connected to the gate, and the first aluminum electrode is electrically connected to the source region.

* * * * *